United States Patent [19]
Chen et al.

[11] Patent Number: 5,162,668
[45] Date of Patent: Nov. 10, 1992

[54] SMALL DROPOUT ON-CHIP VOLTAGE REGULATORS WITH BOOSTED POWER SUPPLY

[75] Inventors: Chih-Liang Chen, Briarcliff; Sang H. Dhong; Hyun J. Shin, both of Mahopac, all of N.Y.

[73] Assignee: International Business Machines Corporation, Armonk, N.Y.

[21] Appl. No.: 880,286

[22] Filed: May 4, 1992

Related U.S. Application Data

[63] Continuation of Ser. No. 627,683, Dec. 14, 1990, abandoned.

[51] Int. Cl.⁵ ............................................. H03K 3/01
[52] U.S. Cl. .................................. 307/296.8; 307/482
[58] Field of Search ................. 307/359, 296.6, 996.8, 307/264, 482; 323/282, 273, 274

[56] References Cited

U.S. PATENT DOCUMENTS

| | | | |
|---|---|---|---|
| 3,808,468 | 4/1974 | Ludlow | 307/296.2 |
| 4,259,601 | 3/1981 | Stein | 307/359 |
| 4,322,675 | 3/1982 | Lee et al. | |
| 4,553,047 | 11/1985 | Dillinger et al. | |
| 4,638,184 | 1/1987 | Kimura | |
| 4,716,307 | 12/1987 | Aoyama | |
| 4,752,699 | 6/1988 | Cranford, Jr. et al. | |
| 4,820,936 | 4/1989 | Veendrick | 307/296.2 |
| 4,843,257 | 6/1989 | Ohsawa | 307/296.8 |
| 4,916,334 | 4/1990 | Minagawa | 307/296.5 |
| 5,010,259 | 4/1991 | Inoue | 307/482 |
| 5,021,682 | 6/1991 | Hobrecht | 307/296.8 |

Primary Examiner—Eugene R. LaRoche
Assistant Examiner—A. Zarabian
Attorney, Agent, or Firm—Scully, Scott, Murphy & Presser

[57] ABSTRACT

Novel boosted power supplies are disclosed for an internal, on-chip regulator circuit which includes a differential amplifier coupler to a series regulating element operating as a source follower, and in which a voltage pump circuit is provided to generate a boosted power supply for the differential amplifier. The voltage pump preferably includes a ring oscillator for supplying pulses for the voltage pump. The new on-chip voltage regulators are designed for n-well CMOS technology circuits, and can be applied to BiCMOS as well as n-well CMOS circuits. The new circuits utilize voltage boosting techniques to increase the potential at the gate of the series regulating element operating as a source follower, and also improve the power supply rejection. Furthermore, these circuits preferably use clamping diodes to limit negative voltage swings at the gate of the series regulating element and to improve the settling time of the voltage regulator circuit. The on-chip regulator circuits are well suited for small dropout voltage regulator applications, have less external power supply sensitivity, use a clamping diode to improve the settling time of the feedback loop, and can utilize either static or dynamically controlled pump circuitry.

14 Claims, 7 Drawing Sheets

SMALL DROPOUT ON-CHIP VOLTAGE REGULATORS WITH BOOSTED POWER SUPPLY

This is a continuation of copending application Ser. No. 627,683 filed on Dec. 14, 1990, abandoned.

BACKGROUND OF THE INVENTION

1. Field of the Invention

The present invention relates generally to a novel boosted power supply for an internal, on-chip regulator circuit which includes a differential amplifier coupled to a series regulating element operating as a source follower. In greater detail, pursuant to the teachings of the subject invention, a voltage pump circuit is provided to generate a boosted power supply for the differential amplifier.

2. Discussion of the Prior Art

As CMOS technologies scale down with consequential gate length reduction, the power supply voltages need to be lowered to prevent problems associated with breakdown, punch-through, and/or hot-carrier related problems. However, the external power supply voltages cannot be reduced easily because the system power supplies tend to remain at standard levels, e.g., 5 V or 3.3/3.6 V (in the foreseeable future). One way to satisfy these requirements is to use on-chip voltage regulators with a dropout voltage equal to the difference between the system power supply and a scaled internal power supply. Typical CMOS on-chip regulator circuits consist of a differential amplifier and a series regulating element operating in a source-follower mode. However, these circuits are not suited for small dropout applications such as 3.3/3.6 to 2.5 V conversion, and also have problems with poor power supply rejection.

SUMMARY OF THE INVENTION

Accordingly, it is a primary object of the present invention to provide a novel boosted power supply for an internal, on-chip regulator circuit which includes a differential amplifier coupled to a series regulating element operating as a source follower, and in which a voltage pump circuit is provided to generate a boosted power supply for the differential amplifier.

A further object of the subject invention is the provision of a boosted power supply structure for an internal, on-chip regulator circuit comprising a differential amplifier coupled to a source follower circuit, and a voltage pump circuit, including a ring oscillator for supplying pulses for the voltage pump, for generating a boosted power supply for the differential amplifier.

The present invention provides new on-chip voltage regulators for n-well CMOS technology circuits that solve the problems associated with prior art circuits as discussed hereinabove. The new circuits utilize voltage boosting techniques to increase the potential at the gate of the series regulating element operating as a source follower, and also improve the power supply rejection. Furthermore, these circuits preferably use clamping diodes to limit negative voltage swings at the gate of the series regulating element and to improve the settling time of the voltage regulator circuit. The new techniques can be applied to BiCMOS voltage regulators as well as n-well CMOS circuits. In the disclosed circuits, the differential amplifier comprises complementary p channel FET devices and n channel FET devices, and the boosted power supply of the voltage pump circuit is coupled to the sources of the p channel FET devices.

The on-chip regulator circuits of the present invention use voltage boosting techniques, are well suited for small dropout voltage regulator applications, have less external power supply sensitivity, use a clamping diode to improve the settling time of the feedback loop, and utilize either static or dynamically-controlled pump circuitry.

In several preferred embodiments, the voltage pump and ring oscillator comprise a static voltage pump and ring oscillator circuit. Alternatively, the voltage pump and ring oscillator can comprise a dynamically controlled voltage pump and ring oscillator circuit wherein the dynamically controlled voltage pump and ring oscillator circuit is voltage controlled in feedback from a further differential amplifier coupled through an inverter to the gate of the source follower.

In greater detail, in one embodiment, the voltage pump comprises p-n diodes formed by p-diffusion into an n-diffusion well. In another embodiment, the voltage pump circuit is coupled as an electrical load for the differential amplifier.

DESCRIPTION OF THE DRAWINGS

The foregoing objects and advantages of the present invention for small dropout on-chip voltage regulators with boosted power supply may be more readily understood by one skilled in the art with reference being had to the following detailed description of several preferred embodiments thereof, taken in conjunction with the accompanying drawings wherein like elements are designated by identical reference numerals and letters throughout the several views, and in which.

DETAILED DESCRIPTION OF THE DRAWINGS

As CMOS technologies scale down with consequential gate length reduction, the power supply voltages need to be lowered to prevent problems associated with breakdown, punch-through, and/or hot-carrier related problems. However, the external power supply voltages cannot be reduced easily because the system power supplies tend to remain at standard levels, e.g., 5 V or 3.3/3.6 V (in the foreseeable future). One way to satisfy both requirements is to use on-chip voltage regulators with a dropout voltage equal to the difference between the system power supply and a scaled internal power supply.

In the description of the following circuits, devices such as MP1 refer to p channel FETs, all of which have conventional sources, drains and gates. A notation such as $V_{Tpo}$ refers to a threshold voltage of an p channel FET when there is no body effect, while a notation such as $V_{Tn}$ refers to a threshold voltage of a n channel FET when the source is not at ground or zero volts. VCC is the system power supply, VDD(INT) is the scaled internal power supply, VREF is a reference voltage supplied at the desired value of $V_{DD}(INT)$ used to generate $V_{DD}(INT)$, VSS is the voltage of the substrate, $V_W$ is the voltage at node W, $V_D$ is the voltage drop across a diode junction, VCC(INT) is the boosted internal voltage generated pursuant to the present invention as a power supply for the differential amplifier.

Figure 1:
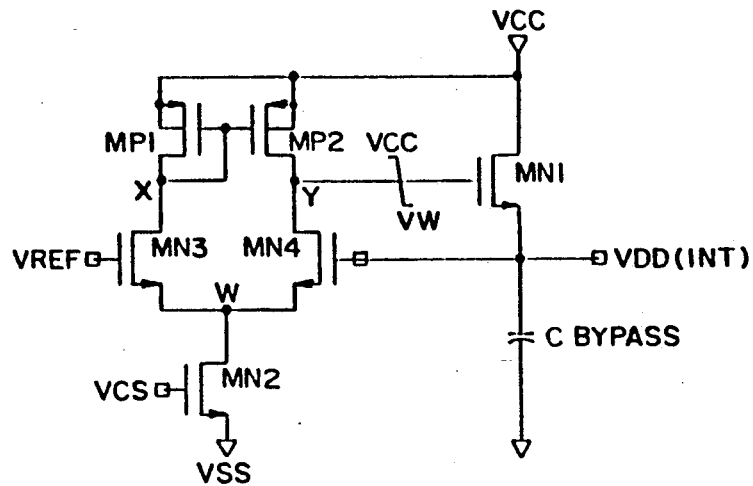
FIG. 1 illustrates a typical prior art CMOS on-chip voltage regulator circuit which includes a differential amplifier and a series regulating circuit element operating in a source-follower mode.

FIG. 1 illustrates a typical prior art CMOS on-chip voltage regulator circuit which includes a differential amplifier and a series regulating circuit element operating in a source-follower mode. As illustrated therein, typical CMOS on-chip voltage regulator circuits consist of a differential amplifier (MN2-MN4 and MP1-MP2) and a series regulating element (MN1) operating in a source-follower mode. In the differential amplifier circuit, the p channel devices and n channel devices are arranged in a standard complementary manner. Because the maximum level at node Y is $V_{CC}$, this regulator has a minimum dropout voltage ($=V_{CC}-V_{DD}(INT)$) of $V_{Tn}$ which is the threshold voltage of MN1. For 2.5-V n-well technology without a special threshold implant (e.g., for a depletion device), $V_{Tn}$ is about 1 V. Noting that extra voltage headroom is needed for the feedback loop to operate properly when the output voltage dips, this circuit is not well suited for small dropout applications such as 3.3/3.6 to 2.5 V conversion. Another problem with this circuit is the poor power supply rejection at node Y. Thus, a VCC variation appearing at Y will in turn appear at VDD(INT) with a little attenuation. Although these problems can be solved by using a PMOSFET for the series element MN1, the circuit response to restore $V_{DD}(INT)$ to $V_{REF}$ after a disturbance would be slower. This circuit also has a large negative voltage swing at node Y (i.e., $V_{Y,min}=V_W$) when $V_{DD}(INT)$ is higher than $V_{REF}$. Because MN1 turns off as long as $V_Y$ is below $V_{DD}(INT)+V_{Tn}$, the unnecessarily large swing would slow down the settling time of the circuit.

The present invention provides new on-chip voltage regulators for n-well CMOS technologies that solve the problems associated with the circuit of FIG. 1. The new circuits utilize voltage boosting techniques to increase the potential at the gate of MN1 and improve the power supply rejection. Also, some of the disclosed circuits preferably use clamping diodes to limit the negative voltage swing at note Y. The new techniques can be applied to BiCMOS voltage regulators as well. In this case, bipolar transistors having higher gains can be used for better performance. It is noted that minor details of the circuits may vary depending upon the particular applications. For the new circuits with clamping diodes, the maximum dropout voltage is assumed to be less than but close to $V_{Tn}+|V_{Tp}|$.

Figure 2:
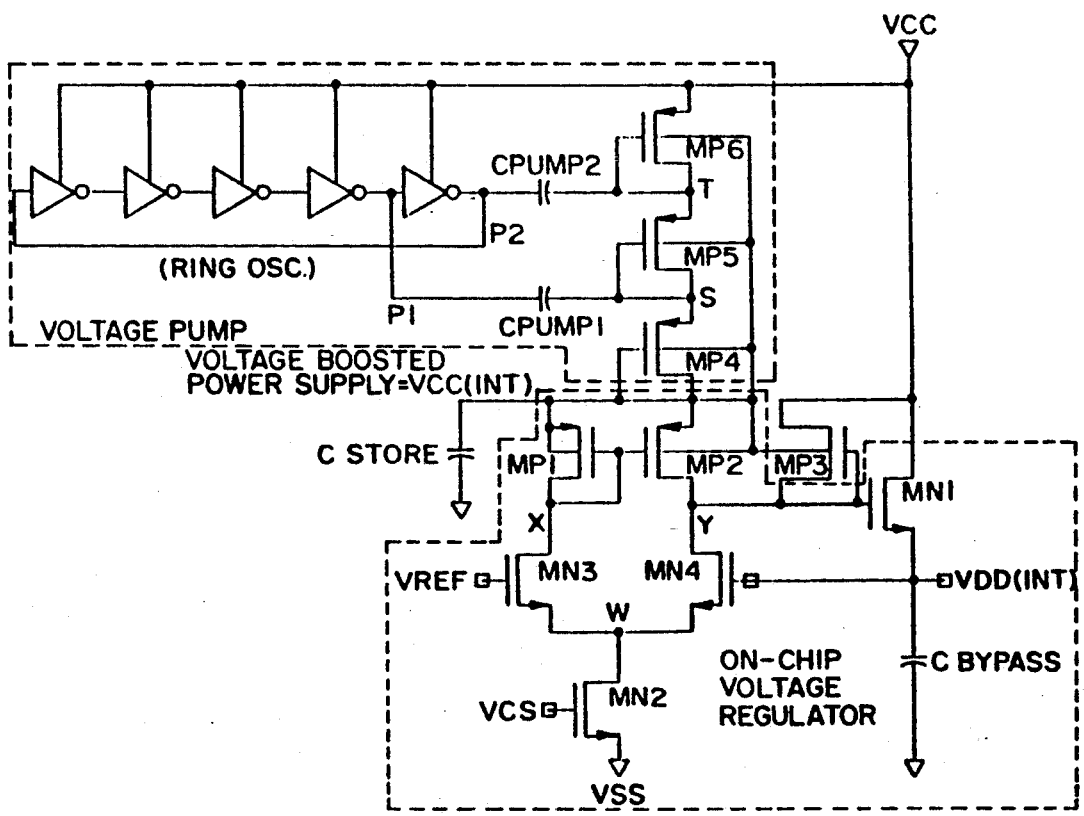
FIG. 2 illustrates a first embodiment of a small dropout voltage regulator circuit pursuant to the present invention which utilizes a voltage pump circuit, including a ring oscillator, for generating a boosted power supply for a differential amplifier, and also includes a clamping diode.
Figure 2A:
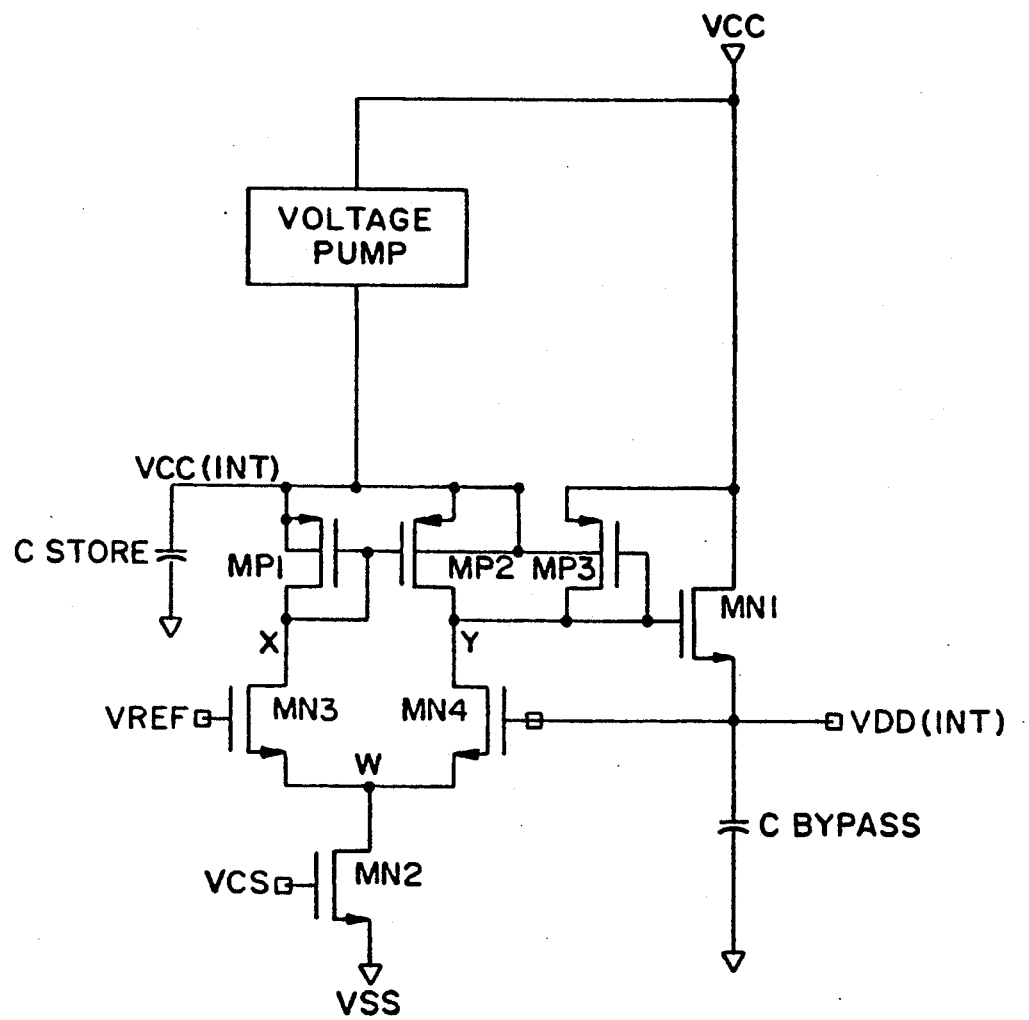
FIG. 2A illustrates a partial block diagram illustrating broadly a small dropout voltage regulator circuit pursuant to the present invention which utilizes a voltage pump circuit for generating a boosted power supply for the differential amplifier, and also includes a clamping diode.

FIG. 2A illustrates a partial block diagram illustrating broadly a small dropout voltage regulator circuit pursuant to the present invention which utilizes a voltage pump circuit for generating a boosted power supply for the differential amplifier, and also includes a clamping diode to limit negative voltage swings at node Y. The clamping diodes can be stacked in series, if necessary, in order to increase the dropout voltage.

FIG. 2 illustrates a first and more detailed embodiment of a voltage pump circuit, including a ring oscillator, for generating a boosted power supply for the differential amplifier, and also includes a clamping diode. Compared to the circuit of FIG. 1, the circuit shown in FIG. 2 features a voltage pump circuit (MP4-MP6, CPUMP1-CPUMP2, CSTORE), including a ring oscillator powered by VCC, that generates a boosted power supply $V_{CC}(INT)$ for the differential amplifier, and a p-MOSFET clamp diode (MP3) to limit the negative voltage swing on Y. The ring oscillator is utilized to supply pulses for the voltage pump circuit, however in alternative embodiments other pulse sources could be utilized in place thereof such as a clock or crystal oscillator. The ring oscillator is illustrated as a five stage arrangement of inverters (which is shown in more detail as complementary upper p devices and lower n devices in FIG. 6), although other numbers of stages such as three or seven or some other number could be utilized in alternative embodiments thereof. The voltage pump is a typical pump circuit in which MP6 functions as a diode to charge CPUMP2 to a voltage MP5 functions as a diode to charge CPUMP1 to a voltage larger than that on CPUMP2, and MP4 functions as a diode to charge CSTORE to a voltage larger than that on CPUMP1, which is VCC(INT). In FIG. 2, the voltage pump is illustrated as a two stage voltage pump, although in other embodiments other numbers of stages could also be utilized.

The circuit preferably uses p-MOSFETs for the diodes in the pump circuit to reduce the diode voltage drop because NMOS diodes would have more voltage drop due to the severe body effect. The well for these p-MOSFETs must be tied to the highest potential node in normal operation (i.e., VCC(INT)). Therefore, before the pump circuit functions when the power is up, the p-n junctions at the sources of MP6 and MP3 are forward biased and $V_{CC}(INT)$ starts from $V_{CC}-V_D$. This reduces the time to boost the potential at VCC(INT). The parasitic substrate pnp should have a sufficiently low gain and the circuit needs to be carefully layed out to prevent latch-up.

Because the differential amplifier operates from the boosted supply $V_{CC}(INT)$ ($>V_{CC}$), the gate of MN1 (Y) can have a higher voltage drive compared to the circuit in FIG. 1. Thus, the new circuit is well suited for small dropout voltage regulation. Furthermore, since high frequency noise on VCC is effectively decoupled from the boosted node VCC(INT), the power supply rejection on Y improves. The settling time of the feedback loop (the differential amplifier and MN1 combination) is reduced because the low level of Y is limited to $V_{CC} - |V_{Tp}|$ through the clamp diode MP3.

Figure 3:
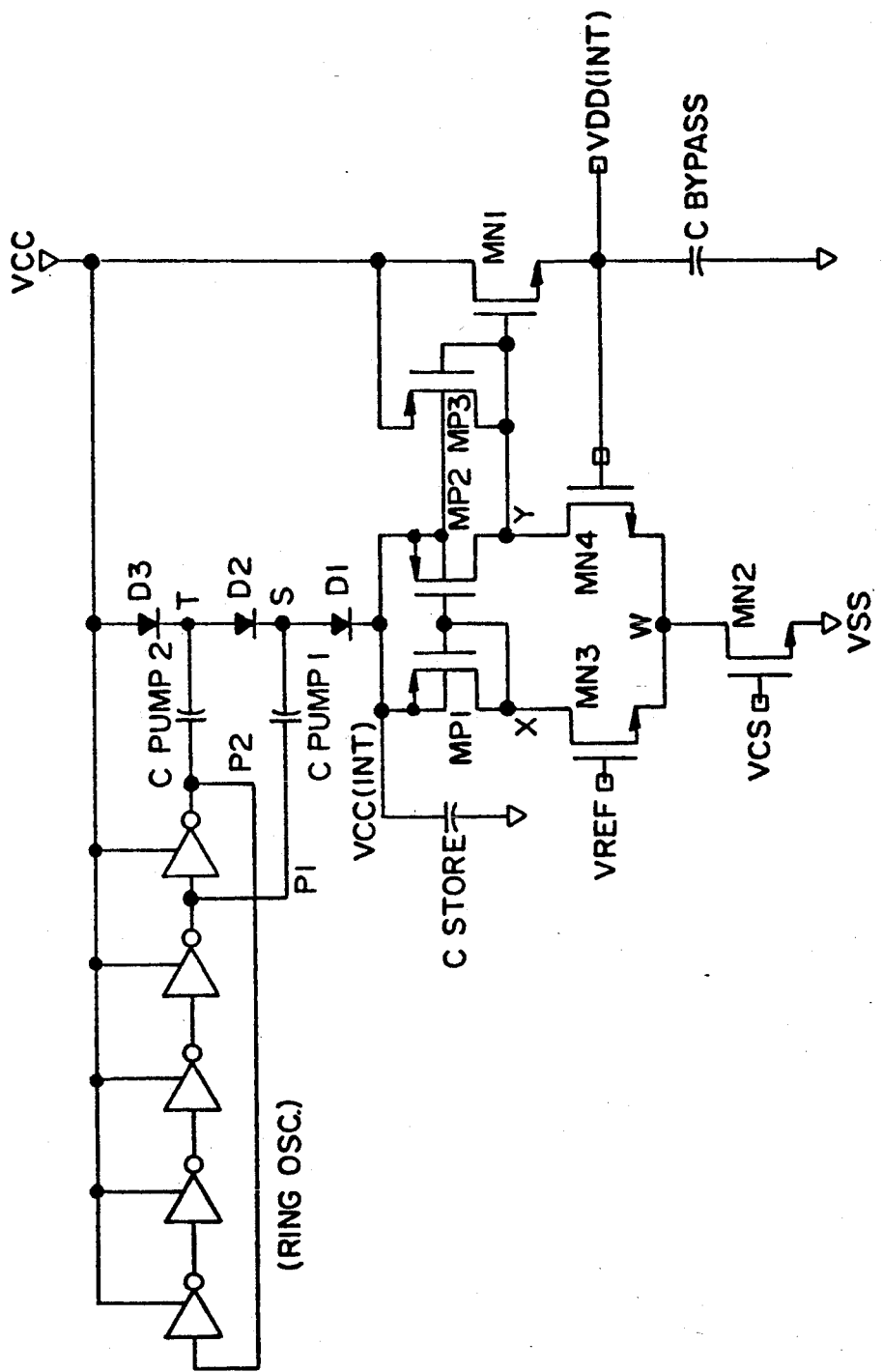
FIG. 3 depicts a second embodiment of the present invention for a small dropout voltage regulator circuit which utilizes p-n diodes created by a p-diffusion into an n-well for the voltage pump circuit of FIG. 2.

FIG. 3 depicts a second embodiment of the present invention for a small dropout voltage regulator circuit which utilizes p-n diodes, which can be formed by p-diffusion into the n-well, in place of the voltage pump circuit of FIG. 2. The p-n diodes between the p-diffusion and n-well can be used for the voltage pump circuit in place of MP4–MP6 as shown in FIG. 3 if a low-impedance diode is needed.

One disadvantage of the circuits in FIGS. 2 and 3 is that the bias current flowing through the differential amplifier is supplied from the boosted node VCC(INT). To supply this constant current (on the order of mA), the effective impedance of the pump circuit must be lowered sufficiently, which would require large size devices in the pump circuit.

Figure 4:
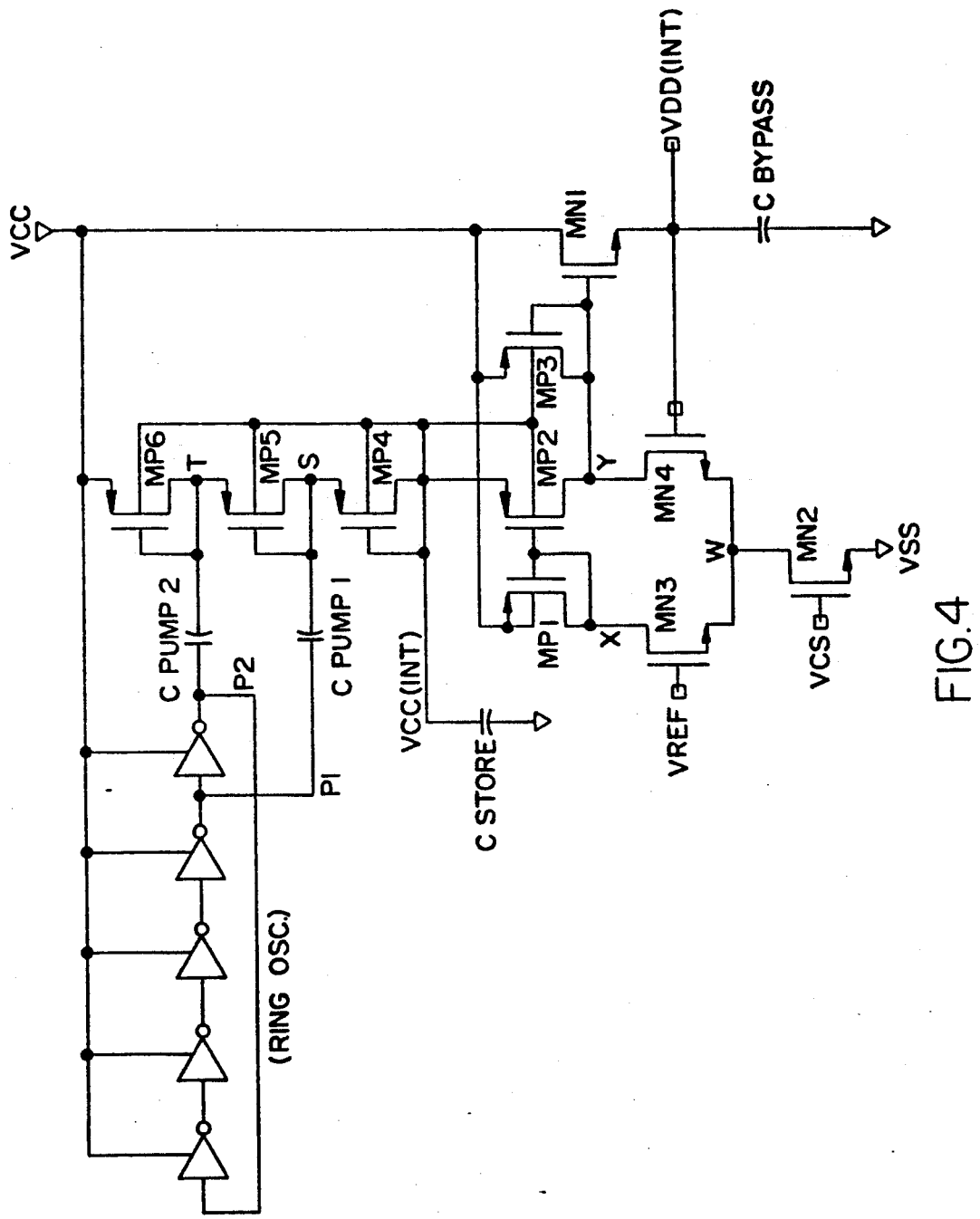
FIG. 4 illustrates a third embodiment of the subject invention for a small dropout voltage regulator circuit which utilizes a voltage pump circuit, including a ring oscillator, for generating a boosted power supply for the differential amplifier, similar to the embodiment of FIG. 2, but which connects the boosted power supply only to the source of MP2 and wherein the source of MP1 is connected to VCC.

FIG. 4 illustrates a third embodiment of the subject invention for a small dropout voltage regulator circuit which utilizes a voltage pump circuit including a ring oscillator for generating a boosted power supply for the differential amplifier, similar to the embodiment of FIG. 2, but which connects the boosted power supply VCC(INT) only to the source of MP2, and wherein the source of MP1 is connected to VCC. As shown in FIG. 4, the drawbacks of the circuits of FIGS. 2 and 3 can be alleviated by connecting the boosted supply only to the source of MP2. In a quiescent state, the current drawn from the pump circuit is one half of the current drawn in the FIGS. 2 and 3 circuits, thus reducing the removal of current from CSTORE. Thus the area of the pump circuit can be reduced by a factor of 2. Also, when $V_{DD}(INT)$ is below $V_{REF}$, the restoring action improves because the MN4/MP2 branch draws almost zero current from the pump circuit.

It should be realized that the advantages and disadvantages of the designs of all of the embodiments disclosed herein are largely dependent upon the particular requirements of a particular application. However, the circuit of FIG. 4 is more difficult to design in an actual implementation than that of FIG. 2, and the circuit of FIG. 2 would probably be preferred over those of FIGS. 3 and 4 in most applications.

Figure 5:
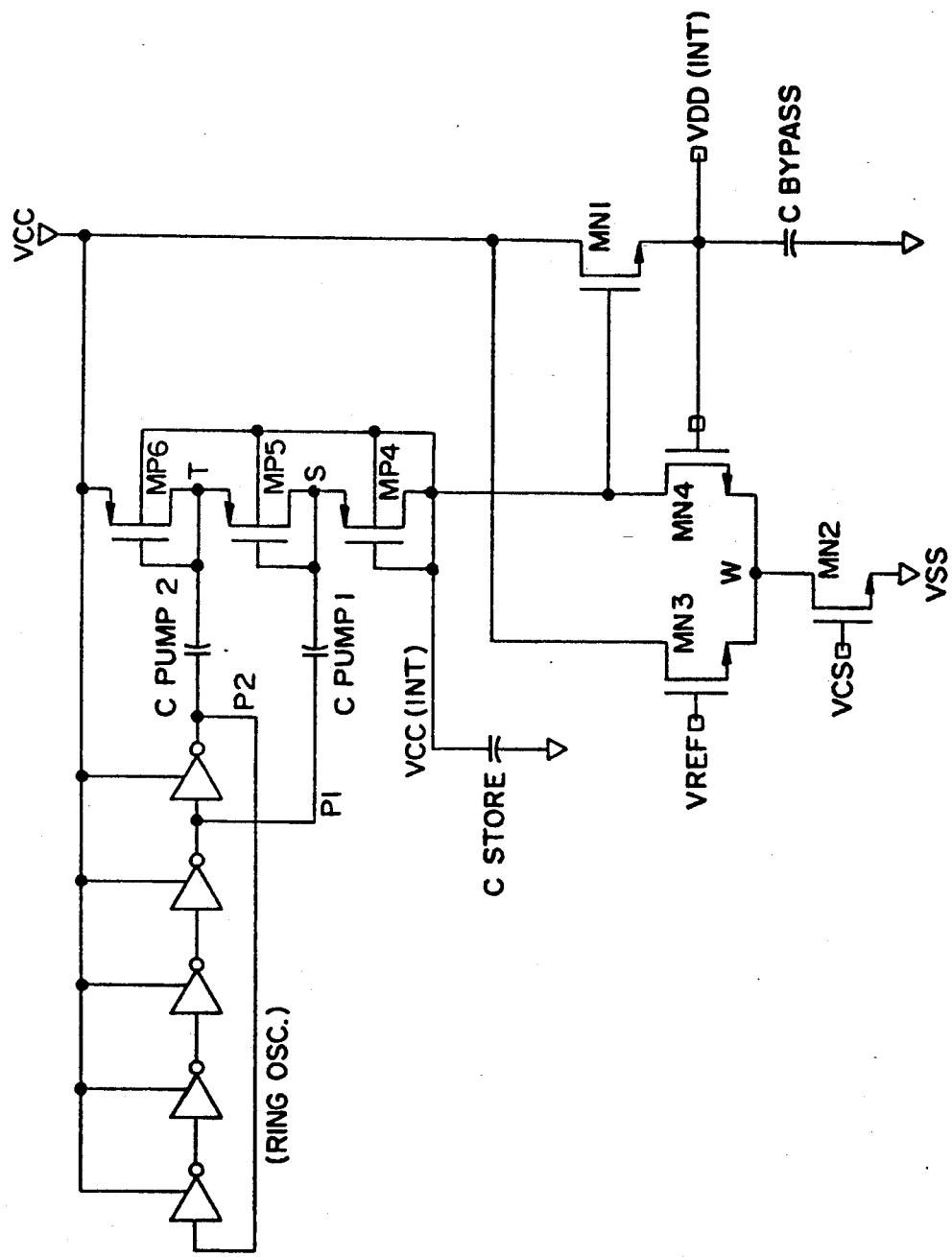
FIG. 5 shows a fourth embodiment of the present invention for a small dropout voltage regulator circuit which utilizes a voltage pump circuit, including a ring oscillator, for generating a boosted power supply for the differential amplifier, similar to the embodiments of FIGS. 2 and 4, but wherein the voltage pump circuit provides the load for the differential amplifier.

FIG. 5 shows a fourth embodiment of the present invention for a small dropout voltage regulator circuit which utilizes a voltage pump circuit, including a ring oscillator, for generating a boosted power supply for the differential amplifier, similar to the embodiments of FIGS. 2 and 4, but wherein the voltage pump circuit provides the load for the differential amplifier. Noting that the voltage pump circuit has non-zero impedance, the active load MP1–MP2 for the differential amplifier may be removed as illustrated in FIG. 5, in which case the voltage pump circuit itself is the load for the differential amplifier. In this new circuit, the clamp diode (MP3 in FIGS. 2–4) is not needed because the p-n diode between the soure and well of MP6 provides clamping for the gate of MN1 (the node VCC(INT)). Although the gain of the amplifier is halved, this new circuit has a smaller device count. The gain of the differential amplifier is halved because the removal of MP4–MP6 leaves only one branch of the load of the differential amplifier. This circuit would also be more difficult to design in an actual implementation as the load characteristics of the pump circuit should match the characteristics of the differential amplifier, while also optimizing the design of the pump circuit.

Figure 6:
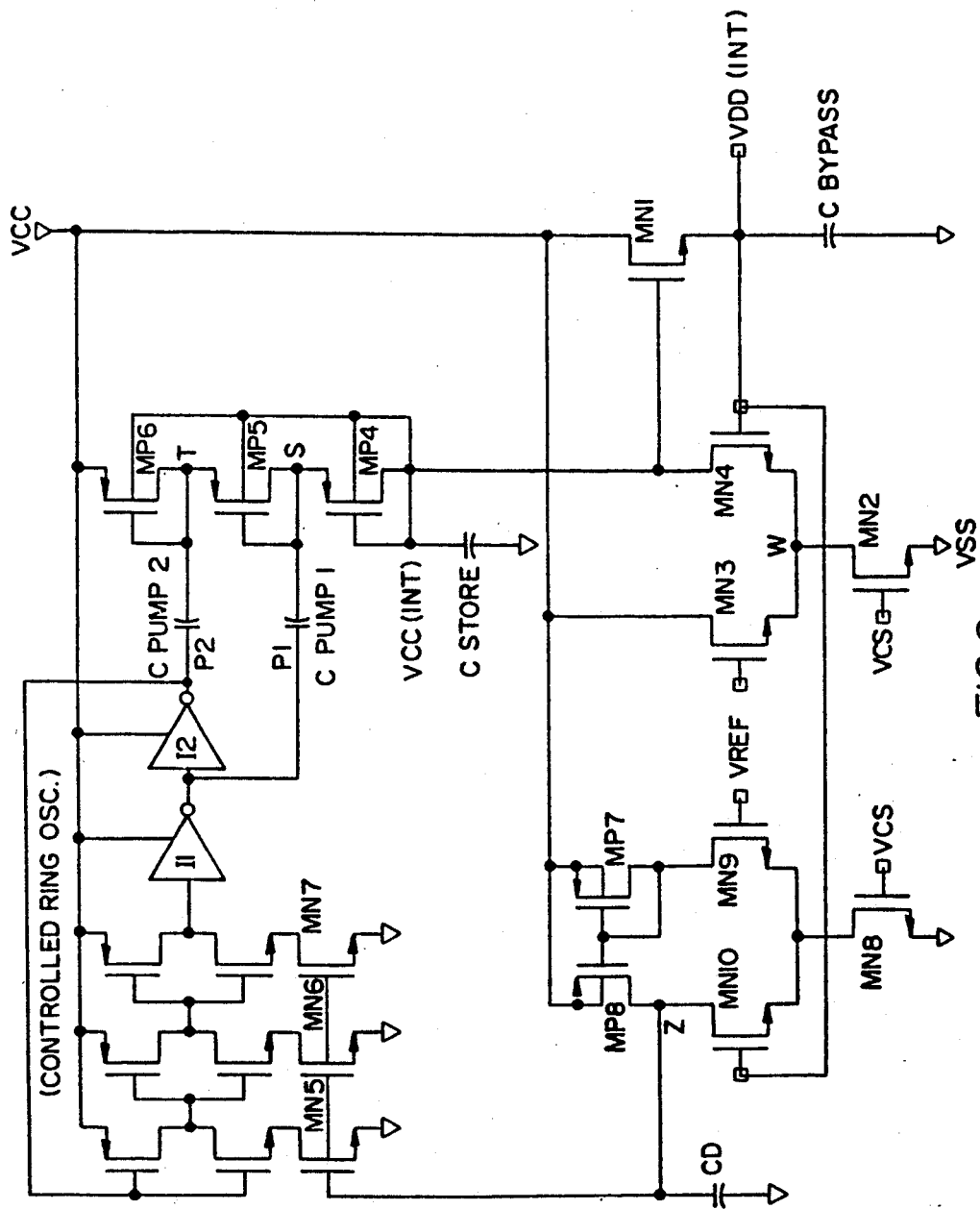
FIG. 6 illustrates a fifth embodiment of the subject invention for a small dropout voltage regulator circuit utilizing a dynamic rather than a static voltage pump circuit which is feedback controlled, including a voltage controlled ring oscillator and an additional differential amplifier.

FIG. 6 illustrates a fifth embodiment of the subject invention for a small dropout voltage regulator circuit utilizing a dynamic rather than a static voltage pump circuit which is feedback controlled, a voltage controlled ring oscillator, and an additional differential amplifier. The circuits disclosed hereinabove utilize a static voltage pump circuit. FIG. 6 shows another new, improved regulator circuit using a dynamic pump circuit which is feedback controlled. This new circuit has a voltage controlled ring oscillator with additional elements MN5–MN7 provided for voltage control, and an additional differential amplifier (MN8–MN10, MP7–MP8) to control the oscillation frequency of the ring oscillator by feedback. This circuit is designed to alleviate some of the difficulties in the design of the circuit of FIG. 5 by providing control in the feedback loop. The fourth and fifth stages of the ring oscillator are standard to provide more power therethrough for the voltage pump.

In operation of the circuit of FIG. 6, if $V_{DD}(INT)$ is lower than $V_{REF}$, the node Z rises and the resistance of MN5–MN7 decreases. Thus, the oscillation frequency increases and the pump circuit impedance decreases. As a result, the node VCC(INT) is boosted more effectively, which helps to restore the desired level on VDD(INT). When $V_{DD}(INT)$ is higher than the reference $V_{REF}$, the voltage at node Z falls and the resistance of MN5–MN7 increases. This causes the frequency to decrease and the pump circuit impedance to increase. Therefore, the boosting slows down (or even stops) and VDD(INT) will fall quickly.

Figure 7:
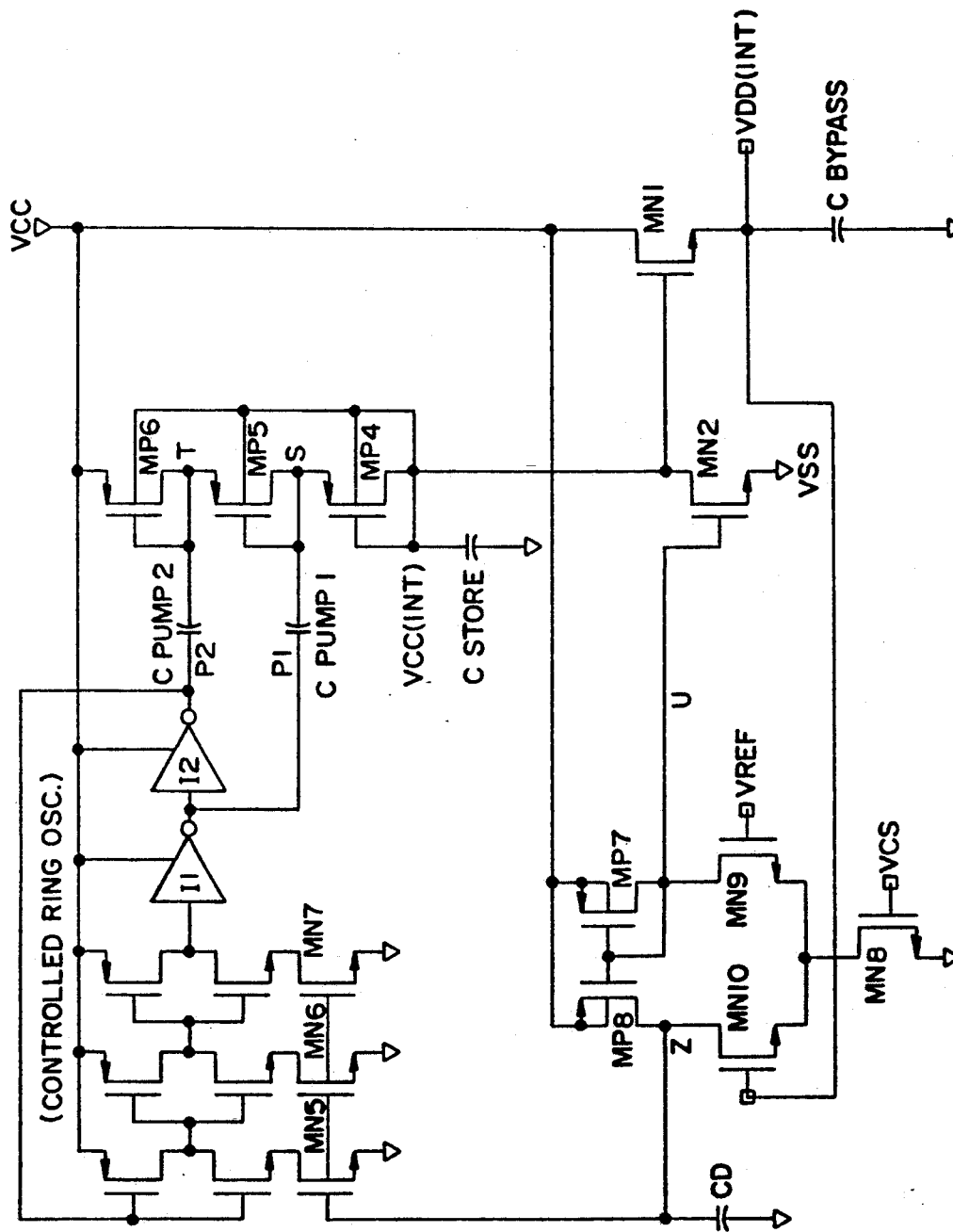
FIG. 7 depicts a sixth embodiment of the present invention similar to that of FIG. 6 wherein the differential pair MN3-MN4 is removed, and a device MN2, the gate of which is controlled by node U, is used to discharge the node VCC(INT).

FIG. 7 depicts a sixth embodiment of the present invention similar to that of FIG. 6 wherein the differential pair MN3–MN4 is removed, and a device MN2, the gate of which is controlled by node U, is used to discharge the node VCC(INT). In the circuit of FIG. 7, the device count is reduced relative to the circuit in FIG. 6 by removing the differential pair (MN3–MN4) and using MN2 to discharge the node VCC(INT). The gate of MN2 is controlled by the node U. In this circuit, element MN2 inverts the output of element MP7 to control the gate of MN1. In operation of this circuit, if the output dips, U drops also, and VCC(INT) rises to restore the output level. In the opposite case, when U increases then VCC(INT) and VDD(INT) fall.

Once again, it should be realized that the advantages and disadvantages of the designs of all of the embodiments disclosed herein are largely dependent upon the particular requirements of a particular application. However, the circuits of FIGS. 5 and 7 are more difficult to design in an actual implementation than that of FIG. 6, and the circuit of FIG. 6 would probably be preferred over those of FIGS. 5 and 7 in most applications.

While several embodiments and variations of the present invention for small dropout on-chip voltage regulators with boosted power supply are described in detail herein, it should be apparent that the disclosure and teachings of the present invention will suggest many alternative designs to those skilled in the art.

What is claimed is:

1. A voltage boosted power supply for an internal, on-chip voltage regulator circuit, comprising:
   a. supply voltage $V_{cc}$ for the internal, on-chip voltage regulator circuit;
   b. an analog regulating differential amplifier means having a positive input terminal and a negative input terminal;
   c. a reference voltage $V_{REF}$, which is lower than said supply voltage $V_{cc}$, coupled to the positive input terminal of said differential amplifier means;
   d. a source follower means coupled to said supply voltage $V_{CC}$ and also coupled to the output of said differential amplifier means and defining at its output a scaled internal power supply voltage $V_{DD}(INT)$ which is coupled to the negative input terminal of said differential amplifier means for feedback controlled voltage regulation to maintain the scaled internal power supply voltage $V_{DD}(INT)$ equal to the reference voltage $V_{REF}$; and
   e. a voltage pump circuit means, coupled to said supply voltage $V_{CC}$, for generating a boosted power supply voltage, higher than said supply voltage $V_{CC}$, for said differential amplifier to provide a higher scaled internal power supply voltage $V_{DD}(INT)$.

2. A voltage boosted power supply for an internal, on-chip voltage regulator circuit as claimed in claim 1, wherein said source follower means includes a source, a drain and a gate, and further comprising a clamping diode means coupled to the gate of said source follower means to limit negative voltage swings thereat to improve the settling time of the voltage regulator circuit.

3. A voltage boosted power supply for an internal, on-chip voltage regulator circuit as claimed in claim 1, wherein said voltage pump circuit means includes a ring oscillator means for providing pulses for said voltage pump circuit means.

4. A voltage boosted power supply for an internal, on-chip voltage regulator circuit as claimed in claim 3, wherein said voltage pump means and ring oscillator means comprises a static voltage pump and ring oscillator circuit.

5. A voltage boosted power supply for an internal, on-chip voltage regulator circuit as claimed in claim 3, wherein said voltage pump means and ring oscillator means comprises a dynamically controlled voltage pump circuit and ring oscillator circuit.

6. A voltage boosted power supply for an internal, on-chip voltage regulator circuit as claimed in claim 5, wherein said dynamically controlled voltage pump and ring oscillator circuit is voltage controlled in feedback from a further differential amplifier.

7. A voltage boosted power supply for an internal, on-chip voltage regulator circuit as claimed in claim 6, wherein said source follower means includes a source, a drain and a gate, and said further differential amplifier means is coupled through an inverter to the gate of said source follower means.

8. A voltage boosted power supply for an internal, on-chip voltage regulator circuit as claimed in claim 1, wherein said voltage pump means comprises p-n diodes formed by p-diffusion into an n-diffusion well.

9. A voltage boosted power supply for an internal, on-chip voltage regulator circuit as claimed in claim 1, wherein said voltage pump circuit means is coupled as an electrical load for said differential amplifier means.

10. A voltage boosted power supply for an internal, on-chip voltage regulator circuit as claimed in claim 1, wherein the circuits are constructed with CMOS technology.

11. A voltage boosted power supply for an internal, on-chip voltage regulator circuit as claimed in claim 10, wherein the circuits are constructed with n-well CMOS technology.

12. A voltage boosted power supply for an internal, on-chip voltage regulator circuit as claimed in claim 10, wherein the circuits are constructed with BiCMOS technology.

13. A voltage boosted power supply for an internal, on-chip voltage regulator circuit as claimed in claim 1, wherein said differential amplifier means comprises complementary p channel FET devices and n channel FET devices.

14. A voltage boosted power supply for an internal, on-chip voltage regulator circuit as claimed in claim 13, wherein the boosted power supply of said voltage pump circuit means is coupled to the sources of said p channel FET devices.

* * * * *